(12) United States Patent
Nasiri et al.

(10) Patent No.: US 7,104,129 B2
(45) Date of Patent: *Sep. 12, 2006

(54) VERTICALLY INTEGRATED MEMS STRUCTURE WITH ELECTRONICS IN A HERMETICALLY SEALED CAVITY

(75) Inventors: Steven S. Nasiri, Saratoga, CA (US); Anthony Francis Flannery, Jr., Los Gatos, CA (US)

(73) Assignee: InvenSense Inc., Santa Clara, CA (US)

( * ) Notice: Subject to any disclaimer, the term of this patent is extended or adjusted under 35 U.S.C. 154(b) by 184 days.

This patent is subject to a terminal disclaimer.

(21) Appl. No.: 10/770,838

(22) Filed: Feb. 2, 2004

(65) Prior Publication Data

US 2005/0166677 A1 Aug. 4, 2005

(51) Int. Cl.
*G01C 19/00* (2006.01)
*G01P 3/44* (2006.01)

(52) U.S. Cl. .................. 73/514.29; 73/504.04

(58) Field of Classification Search ............ 73/514.29, 73/514.16, 514.32, 504.12, 504.04; 438/48–55, 438/107–108, 455–456, 612–613, 64

See application file for complete search history.

(56) References Cited

U.S. PATENT DOCUMENTS

| | | | |
|---|---|---|---|
| 5,367,194 A | 11/1994 | Beatty | 257/727 |
| 5,656,778 A * | 8/1997 | Roszhart | 73/504.04 |
| 5,659,195 A | 8/1997 | Kaiser et al. | 257/415 |
| 5,915,168 A | 6/1999 | Salatino et al. | 438/110 |
| 6,036,872 A | 3/2000 | Wood et al. | 216/2 |
| 6,153,917 A * | 11/2000 | Matsunaga et al. | 257/419 |
| 6,229,190 B1 | 5/2001 | Bryzek et al. | 257/419 |
| 6,426,687 B1 | 7/2002 | Osborn | 333/262 |
| 6,433,411 B1 | 8/2002 | Degani et al. | 257/678 |
| 6,448,109 B1 | 9/2002 | Karpman | 438/108 |
| 6,452,238 B1 | 9/2002 | Orcutt et al. | 257/415 |
| 6,479,320 B1 | 11/2002 | Gooch | 438/109 |
| 6,480,320 B1 | 11/2002 | Nasiri | 359/291 |
| 6,519,075 B1 | 2/2003 | Carr et al. | 359/291 |
| 6,528,344 B1 | 3/2003 | Kang | 438/106 |
| 6,555,417 B1 | 4/2003 | Spooner et al. | 438/113 |
| 6,559,530 B1 | 5/2003 | Hinzel et al. | 257/684 |
| 6,621,137 B1 | 9/2003 | Ma et al. | 257/528 |
| 6,660,564 B1 | 12/2003 | Brady | 438/119 |
| 6,808,955 B1 * | 10/2004 | Ma | 438/51 |
| 6,936,491 B1 * | 8/2005 | Partridge et al. | 438/48 |
| 6,936,494 B1 * | 8/2005 | Cheung | 438/55 |
| 2005/0170656 A1 * | 8/2005 | Nasiri et eal. | 438/700 |

* cited by examiner

*Primary Examiner*—Helen Kwok
(74) *Attorney, Agent, or Firm*—Sawyer Law Group LLP

(57) ABSTRACT

A MEMS assembly having a MEMS subassembly sandwiched between and bonded to a cap and a base is provided. The MEMS subassembly includes at least one MEMS device element flexibly connected to the MEMS assembly. The vertical separation between the MEMS device element and an electrode on the base is lithographically defined. Precise control of this critical vertical gap dimension is thereby provided.

18 Claims, 8 Drawing Sheets

VERTICALLY INTEGRATED MEMS STRUCTURE WITH ELECTRONICS IN A HERMETICALLY SEALED CAVITY

CROSS REFERENCE TO RELATED APPLICATIONS

This application is related to and claims priority from application Ser. Nos. 10/690,224 and 10/691,472, both filed on Oct. 20, 2003, and both of which are hereby incorporated by reference.

FIELD OF THE INVENTION

This invention is related to microelectromechanical systems (MEMS) devices and fabrication of MEMS devices.

BACKGROUND

MEMS technology has been under steady development for some time, and as a result various MEMS devices have been considered and demonstrated for several applications. MEMS technology is an attractive approach for providing inertial sensors, such as accelerometers for measuring linear acceleration and gyroscopes for measuring angular velocity. A MEMS inertial sensor typically includes a proof mass which is flexibly attached to the rest of the device. Relative motion between the proof mass and the rest of the device is driven by actuators and/or sensed by sensors in various ways, depending on the detailed device design. Other MEMS applications include optical applications such as movable mirrors, and RF applications such as RF switches and resonators.

Since MEMS fabrication technology is typically based on processing planar silicon wafers, it is useful to classify MEMS devices according to whether the actuation and/or sensing performed in an inertial sensor (or other application) is in-plane or out of plane (i.e., vertical). More specifically, a device is "in-plane" if all of its sensing and/or actuation is in-plane, otherwise it is "vertical". In-plane devices tend to be easier to fabricate than vertical devices, but vertical devices tend to provide performance advantages compared to in-plane devices. Furthermore, certain device functions, such as sensing rotation about an in-plane axis, cannot be performed by in-plane devices. Thus vertical MEMS devices are also undergoing steady development, despite fabrication difficulties that tend to increase cost.

One approach which has been used to fabricate vertical MEMS devices is hybrid integration, where elements of a MEMS assembly are individually assembled to form the desired vertical structure. For example, attachment of a spacer to a substrate, followed by attachment of a deformable diaphragm to the spacer, provides a vertical MEMS structure having a spacing between diaphragm and substrate controlled by the spacer. U.S. Pat. No. 6,426,687 provides further information on this approach. Although hybrid integration can provide vertical MEMS devices, the cost tends to be high, since manual processing steps are usually required, and because hybrid integration is typically performed on single devices. Therefore, there is a need for reduced cost integrated MEMS devices that is unmet in the prior art.

OBJECTS AND ADVANTAGES

Accordingly, it is an object of the invention to reduce the cost of integrated MEMS devices by providing wafer scale vertical integration.

A further object of the invention is to provide hermetic sealing of integrated MEMS devices.

Another object of the invention is to provide enhanced compatibility of MEMS technology with standard CMOS technology.

Yet another object of the invention is to provide precise control of a vertical gap within an integrated MEMS device.

Still another object of the invention is to provide both electrical and mechanical connection between layers in an integrated MEMS device in the same processing step.

A further object of the invention is to provide vertical integration of a MEMS device without the use of vertical vias in the MEMS device layer.

Another object of the invention is to reduce the need for high voltage trace routing on the MEMS device layer.

Yet another object of the invention is to provide protection for delicate MEMS device elements during device dicing and packaging.

Still another object of the invention is to provide two or more sealed MEMS devices on a single chip.

SUMMARY

The present invention provides a MEMS assembly having a MEMS subassembly sandwiched between and bonded to a cap and a base. The MEMS subassembly includes at least one MEMS device element (e.g., a proof mass for an inertial sensor) flexibly connected to the MEMS assembly. The vertical separation between the MEMS device element and an electrode on the base is lithographically defined. Precise control of this critical vertical gap dimension is thereby provided. The present invention also provides wafer-scale fabrication methods for providing MEMS assemblies having a lithographically defined vertical electrode gap between the MEMS device element and the base. Fabrication cost is thereby greatly reduced.

DETAILED DESCRIPTION

Figure 1:
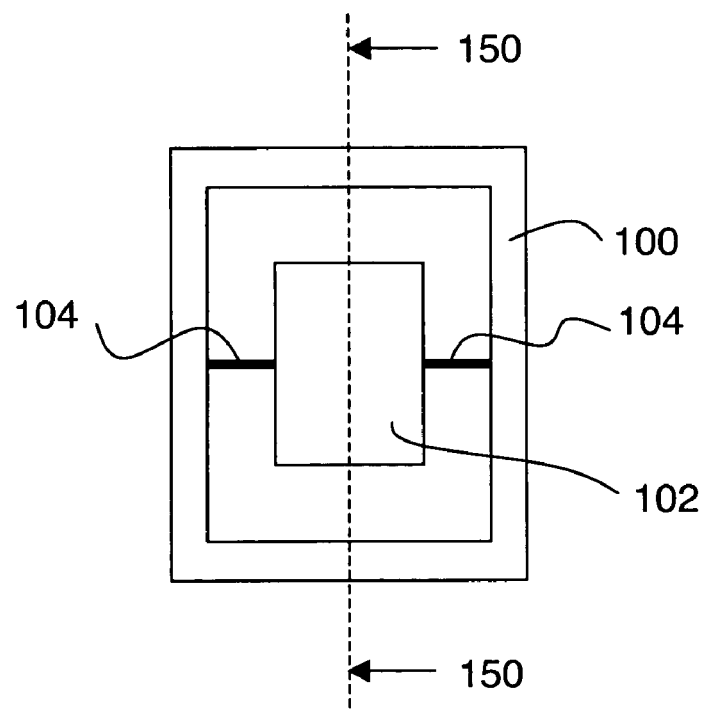
FIG. 1 shows a top view of a portion of a MEMS assembly according to an embodiment of the invention.

FIG. 1 shows a top view of a portion of a MEMS assembly according to an embodiment of the invention. A MEMS device element 102 is positioned within a substantially planar frame 100. Device element 102 can be a proof mass for an inertial sensor, such as an accelerometer or a gyroscope. Alternatively, device element 102 can be a movable element such as a mirror for optical applications, or a movable element within an RF device such as a switch or a resonator. In the example of FIG. 1, device element 102 is flexibly connected to frame 100 with flexures 104. Flexures 104 can be either rotational flexures, permitting rotation about an axis, or translational flexures, permitting linear motion in a particular direction. Frame 100 and device element 102 can be regarded as being included in a MEMS subassembly. More generally, a wide variety of vertical MEMS devices, including inertial sensors such as gyroscopes and accelerometers, optical devices, and RF devices, have a MEMS subassembly having a substantially planar frame and at least one MEMS device element (such as a proof mass) within the frame.

Figure 2:
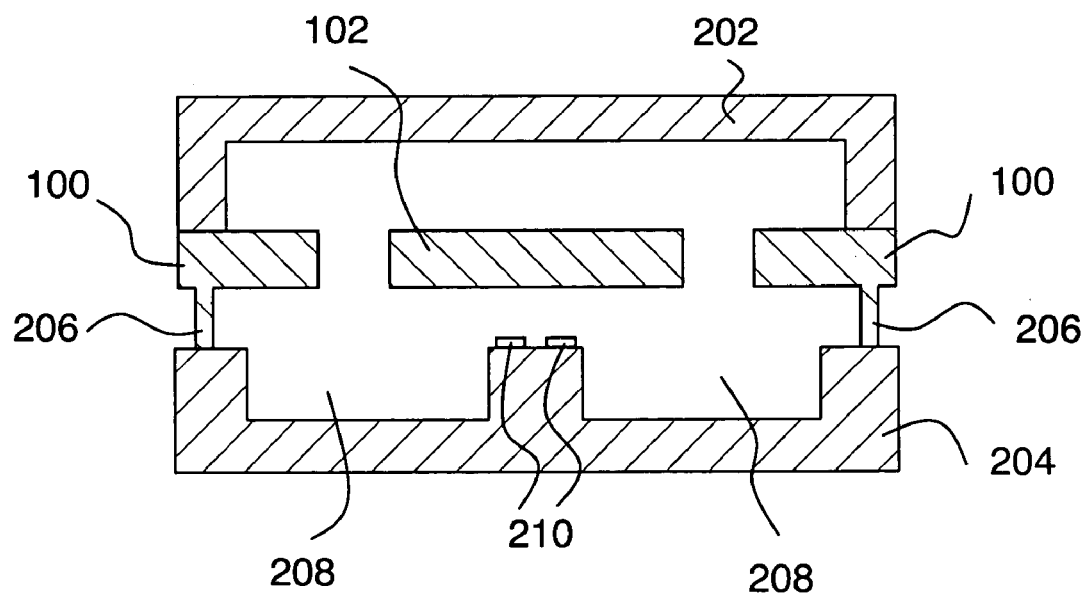
FIG. 2 shows a cross section view of a MEMS assembly including the subassembly of FIG. 1.

FIG. 2 shows a cross section view of a MEMS assembly according to an embodiment of the invention that includes the MEMS subassembly of FIG. 1 viewed along line 150. A cap 202 is bonded to frame 100, and a base 204 is bonded to the opposite side of frame 100. Frame 100 includes a lithographically defined standoff 206 which base 204 is bonded to. Electrodes 210 are disposed on base 204. The separation of electrodes 210 from device element 102 is defined by the height of standoff 206, and is thus lithographically defined. The gap separation may or may not be equal to the height of standoff 206. This gap is a critical dimension for an electrostatic actuator and/or sensor (not shown) including electrodes 210 and device element 102. In some cases, this actuator or sensor includes electrodes (not shown) on device element 102. Preferably, in order to reduce cost, device element 102 is of a material, such as conductive silicon, that is actuable by electrodes 210 across the gap formed by standoff 206 without metal electrodes patterned on its surface. Base 204 preferably also includes recesses 208 to accommodate motion of device element 102. Device element 102 is contained within a cavity formed by frame 100, cap 202 and base 204.

The height of standoff 206 on FIG. 2 is exaggerated for clarity. Preferably, standoff 206 defines a small and precisely controlled gap d having a dimension between about 1 micron and about 10 microns, or in some cases, less than about 2 microns. Provision of such a small gap significantly improves device performance. For example, the sensitivity of an electrostatic sensor including electrodes 210 and device element 102 is proportional to $1/d^2$. Similarly, the power and voltage requirements for electrostatic actuation of device element 102 are proportional to $d^2$. Decreasing the required voltage is an especially significant advantage, since conventional vertical MEMS electrostatic actuators tend to require high voltage signals (i.e., >5 volts), and such high voltage signals tend to induce crosstalk in low voltage electronic circuitry (e.g., CMOS circuitry).

In some cases, it is preferred for the bond between frame 100 and cap 202 and for the bond between frame 100 and base 204 to both be hermetic bonds. In these cases, the cavity surrounding device element 102 is a hermetically sealed cavity. It can be advantageous to provide a reduced pressure (e.g., about 1 mTorr) within such a hermetically sealed cavity. In this manner, resistance to motion of device element 102 is reduced. In other cases, it may be desirable to provide a pressure within the hermetically sealed cavity that is greater than atmospheric pressure. Within such a hermetically sealed cavity, suitable controlled atmospheres include dry air, dry nitrogen, He and Ar.

Figure 3:
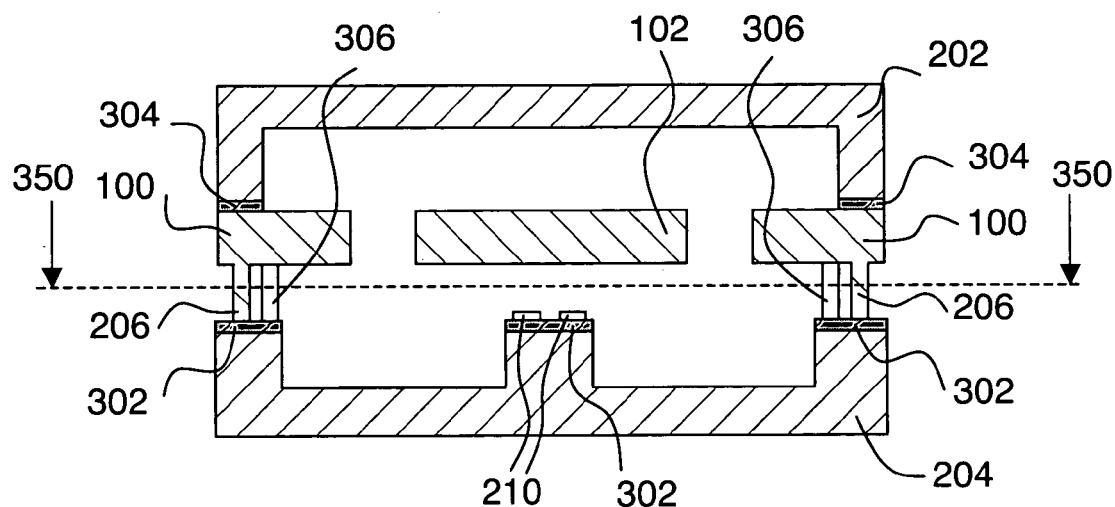
FIG. 3 shows a cross section view of a MEMS assembly according to another embodiment of the invention.

FIG. 3 shows a cross section view of an embodiment of the invention providing vertical integration of MEMS with electronics. Circuitry 302, preferably fabricated with standard CMOS processing technology, is disposed on base 204. Preferably, an insulating layer 304 separates cap 202 from frame 100 to electrically isolate cap 202 from frame 100 and base 204. Electrical contacts 306 provide selective electrical contact between frame 100 and circuitry 302 on base 204.

Figure 4:
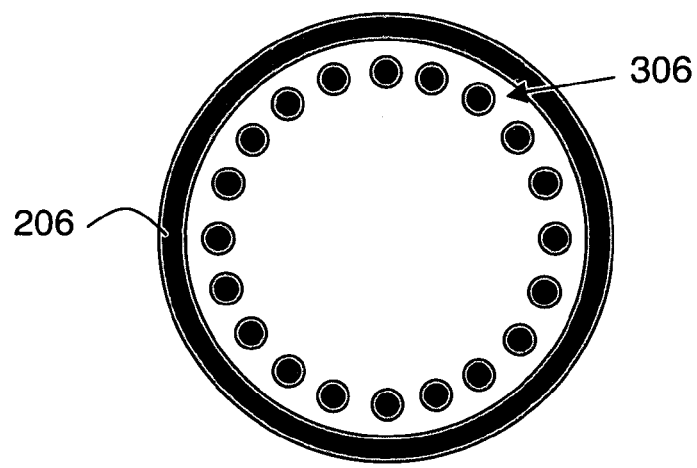
FIG. 4 shows a cross section view of the MEMS assembly of FIG. 3.

FIG. 4 is a cross section view of FIG. 3 along line 350. Preferably, standoff 206 is continuous as shown on FIG. 4 to provide complete encapsulation of device element 102, which can be made hermetic as indicated above. Within the enclosure formed by standoff 206, electrical contacts 306 are disposed, and provide selective electrical contact between points on base 204 (i.e., within circuitry 302), and points on frame 100. In this manner, flexible electrical connectivity is provided between base 204 and the MEMS subassembly. For example, frame 100 can include bond pads electrically connected to two plates of an interdigitated capacitive sensor or actuator within the MEMS subassembly. Such bond pads and plates can be made of metal, but are preferably made of semiconductor to reduce cost by eliminating metallization processing steps from the fabrication of the MEMS subassembly.

In the configuration of FIGS. 3 and 4, surface traces on circuitry 302 in mechanical contact with standoff 206 will also make electrical contact with standoff 206. Therefore, circuitry 302 preferably includes multilayer metallization, so that only desired electrical connections (e.g., a ground connection) are made to standoff 206. In particular, multilayer metallization allows traces for external electrical contacts to be run underneath standoff 206 without making electrical contact to standoff 206. Multilayer metallization is readily available from commercial CMOS foundries, so this preferred approach provides lower cost than a less preferred alternative where selective electrical contacting is obtained by processing of frame 100.

The vertical integration of circuitry 302 with the MEMS subassembly provided by the configuration of FIGS. 3 and 4 provides several advantages. By making electrical and mechanical connections in the same fabrication step, the total number of fabrication steps is reduced, thereby reducing cost. Furthermore, this approach for integrating circuitry 302 within a MEMS assembly does not require fabrication of vertical vias within the MEMS subassembly (i.e., either within frame 100 or within MEMS device element 102), which also reduces cost. Finally, selective electrical contacting is provided by relatively inexpensive processing of base 204, as opposed to relatively costly processing of the MEMS subassembly.

Figure 5:
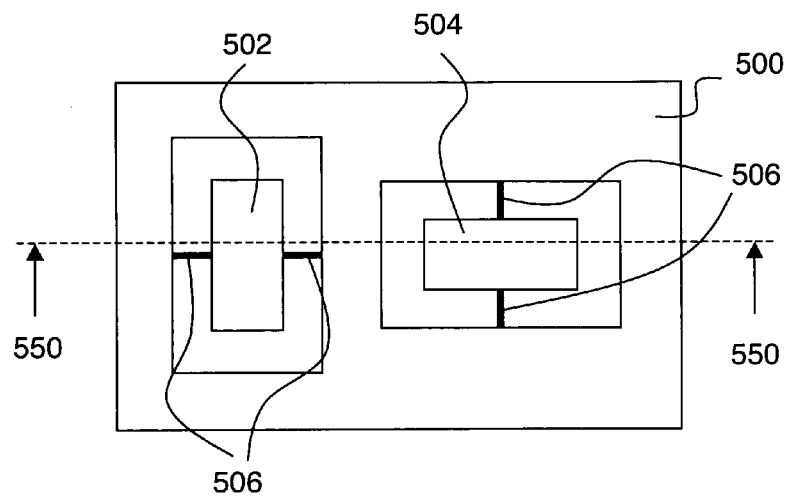
FIG. 5 shows a top view of a MEMS subassembly according to yet another embodiment of the invention.

FIG. 5 shows a top view of an MEMS subassembly according to an alternate embodiment of the invention. In the embodiment of FIG. 5, a substantially planar frame 500 surrounds a first MEMS device element 502 and a second MEMS device element 504. Device elements 502 and 504 can be proof masses for an inertial sensor, such as an accelerometer or a gyroscope. Device elements 502 and 504 are flexibly connected to frame 500 with flexures 506. Flexures 506 can be either rotational flexures, permitting rotation about an axis, or translational flexures, permitting linear motion in a particular direction. In the example of FIG. 5, MEMS device elements 502 and 504 have different constraints on their motion, as would be appropriate for a two-axis gyroscope or a two-axis accelerometer.

Figure 6:
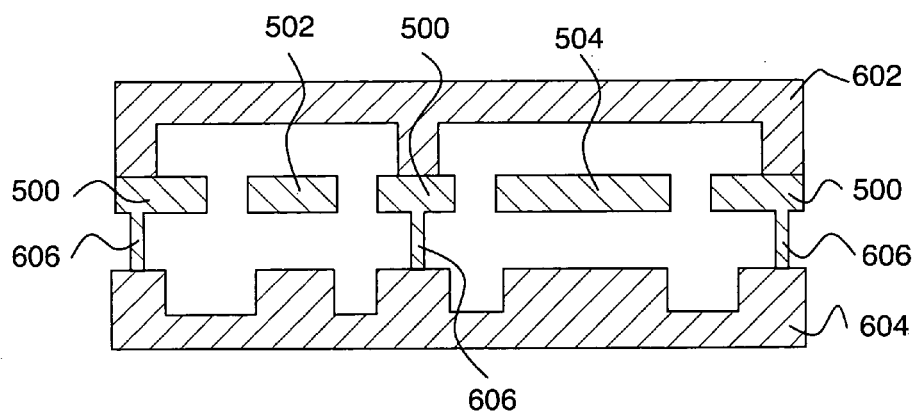
FIG. 6 shows a cross section view of a MEMS assembly including the subassembly of FIG. 5.

FIG. 6 shows a cross section view of a MEMS assembly according to an embodiment of the invention that includes the MEMS subassembly of FIG. 5 viewed along line 550. A cap 602 is bonded to frame 500, and a base 604 is bonded to the opposite side of frame 500. Frame 500 includes a lithographically defined standoff 606 which base 604 is bonded to. The separation between device elements 502 and 504 and electrodes (not shown) on base 604 is defined by the height of standoff 606. Device element 502 is contained within a cavity formed by frame 500, cap 602 and base 604. Similarly, device element 504 is contained within a cavity formed by frame 500, cap 602 and base 604. Thus the embodiment of FIGS. 5 and.6 is basically two instances of the embodiment of FIG. 1 which share the same cap 602 and base 604. Of course, more than two MEMS device elements can also share the same cap and base.

The configuration of FIGS. 5 and 6 is particularly advantageous for providing low cost dual-axis inertial sensors, since the MEMS device element for each axis (e.g., device elements 502 and 504 on FIG. 5) is integrated into a single MEMS device. In addition, the advantages discussed in connection with FIGS. 1 and 2 which reduce cost are also provided by the configuration of FIGS. 5 and 6. Finally, circuitry can be added to base 604 to provide a low cost dual axis MEMS device having vertical integration of electronics having the advantages discussed in connection with FIGS. 3 and 4.

Figure 7:
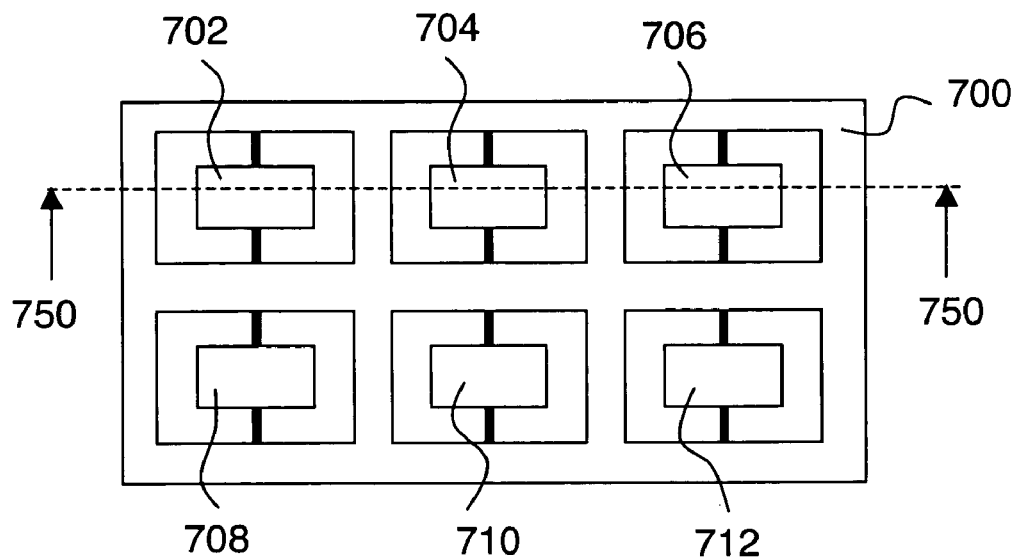
FIG. 7 shows a top view of a wafer scale MEMS subassembly according to a further embodiment of the invention before dicing of individual devices.
Figure 8:
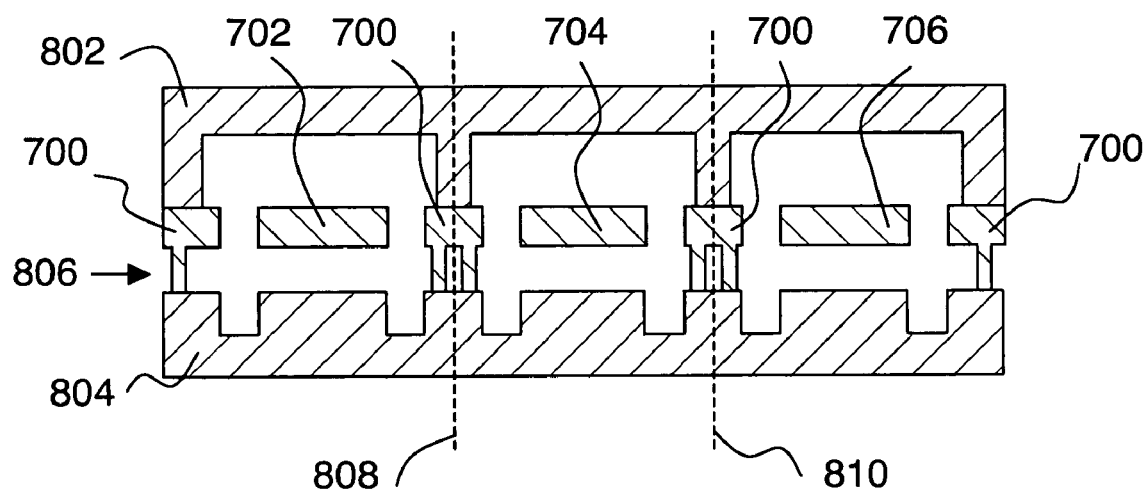
FIG. 8 shows a cross section view of a wafer scale MEMS assembly including the subassembly of FIG. 7.
Figure 9A:
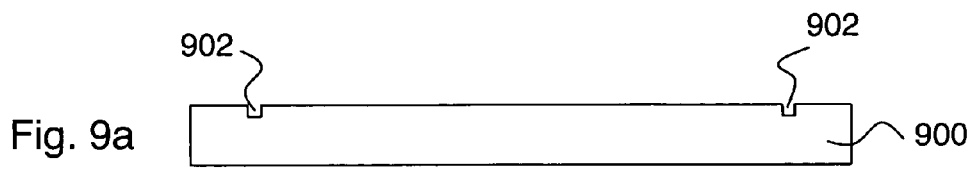
FIGS. 9a–9d show a preferred sequence of processing steps for fabricating a cap wafer according to an embodiment of the invention.
Figure 9B:
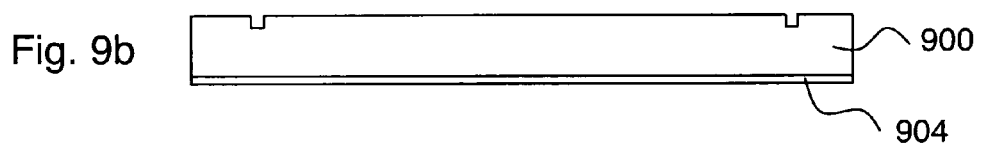
Figure 9C:
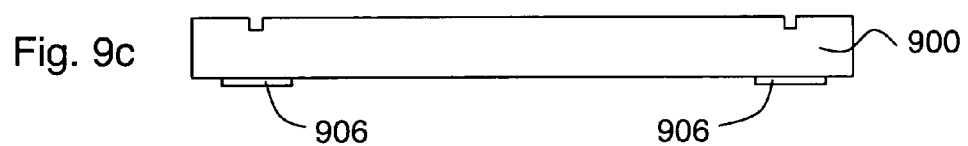
Figure 9D:
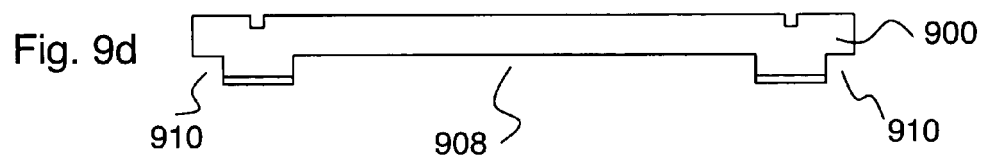

FIG. 7 shows a top view of a wafer scale MEMS subassembly according to a further embodiment of the invention. Multiple MEMS device elements 702, 704, 706, 708, 710 and 712 are all positioned within a substantially planar frame 700. In the example of FIG. 7, six MEMS device elements are shown, but this embodiment of the invention can be practiced with any number of MEMS device elements. FIG. 8 shows a cross section view of a wafer scale MEMS assembly including the subassembly of FIG. 7. A cap 802 is bonded to frame 700, and a base 804 is bonded to a surface of frame 700 facing away from cap 802. A standoff 806 is lithographically defined on frame 700, and determines the gap separating electrodes (not shown) on base 804 from MEMS device elements 702, 704, and 706. The wafer scale assembly formed by frame 700, cap 802 and base 804 is diced into individual devices as indicated by lines 808 and 810.

The wafer scale integration provided by the embodiment of FIGS. 7 and 8 provides significant cost reduction. Cost is reduced because individual processing steps are performed at a wafer level, as opposed to an individual device level, for all processing steps prior to final dicing. It is particularly significant that a critical vertical dimension, namely the vertical gap defined by standoff 806, is defined during wafer-level processing. Furthermore, the MEMS device elements are contained within cavities, which allows final dicing to be performed with conventional dicing equipment and methods. This significantly reduces cost compared to fabrication approaches where special care must be taken during dicing and packaging to avoid damage to exposed MEMS device elements.

FIGS. 9a–d, 10a–d, 11a–b and 12a–b show an exemplary fabrication sequence suitable for fabricating an embodiment of the invention.

FIGS. 9a–d schematically show a sequence of steps suitable for fabricating a cap, such as cap 202 on FIG. 3. On FIG. 9a, cap wafer 900 is patterned with backside alignment marks 902. Marks 902 can be made using reactive ion etching (RIE). In passing from FIG. 9a to FIG. 9b, the surface of cap wafer 900 facing away from alignment marks 902 is cleaned, and then thermally oxidized, to generate an oxide layer 904. Oxide layer 904 is preferably about 0.5 microns thick, and can be made by heating wafer 900 to a high temperature (e.g., greater than 1000 C) in a water-containing ambient environment. In passing from FIG. 9b to FIG. 9c, oxide layer 904 is lithographically patterned, as shown on FIG. 9c, to provide patterned oxide 906. In passing from FIG. 9c to 9d, material of cap wafer 900 not protected by patterned oxide 906 is etched away to a depth of preferably about 100 microns. In this step, a recess 908 to accommodate MEMS device element motion, and openings 910 for external electrical contacts are formed. Deep RIE (DRIE) is a suitable etch method for this step. After the etch, cap wafer 900 is cleaned in preparation for a fusion bond. Suitable cleaning steps include a high temperature (>300 C) ashing step and a sulfuric peroxide dip. The cleaning methods employed must leave patterned oxide layer 906 intact. At this point in the process, cap wafer 900 essentially has the configuration of cap 202 of FIG. 2.

FIGS. 10a–d schematically show a sequence of processing steps suitable for fabricating a MEMS wafer 1000. MEMS wafer 1000 is preferably a prime low total thickness variation (TTV) wafer. MEMS wafer 1000 is cleaned with a sulfuric peroxide dip and is then fusion bonded to patterned oxide 906 on cap wafer 900, as shown on FIG. 10a. Since this bonding is the first bonding step in the processing sequence, relatively high temperature bonding processes are preferred for bonding cap wafer 900 to MEMS wafer 1000. Suitable processes include but are not limited to: eutectic metal bonding, glass bonding, solder bonding, gold eutectic bonding, Si to $SiO_2$ fusion bonding and Si to Si fusion bonding. The bond between cap wafer 900 and MEMS wafer 1000 can be hermetic, or it can be non-hermetic for applications not requiring hermeticity.

Figure 10A:
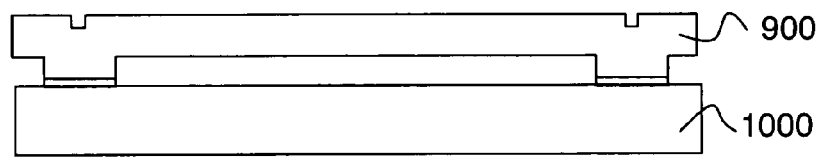
FIGS. 10a–10d show a preferred sequence of processing steps for fabricating a MEMS wafer according to an embodiment of the invention.
Figure 10B:
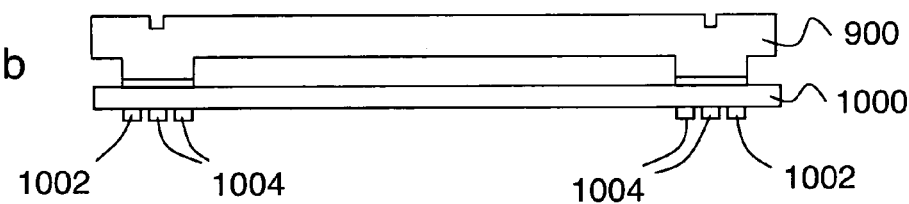

In passing from FIG. 10a to FIG. 10b, MEMS wafer 1000 is thinned from typically about 500 microns thickness to a thickness preferably between about 10 microns and about 150 microns (e.g., about 40 microns). Precision grinding and polishing is a suitable method for performing this thinning step. After MEMS wafer 1000 is thinned, standoff 1002 on FIG. 10b and selective contacts 1004 are formed by lithographic patterning followed by an etch. A KOH etch is preferable for this step, since it is a precisely controllable etch that also provides wafer scale uniformity.

Figure 10C:
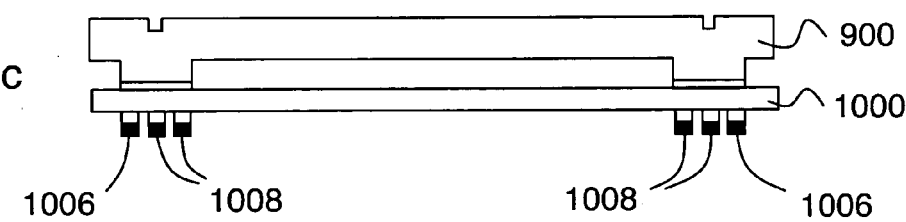

In passing from FIG. 10b to FIG. 10c, patterned contact 1006 is deposited on standoff 1002. In addition, patterned contacts 1008 are deposited on selective contacts 1004. Preferably, patterned contacts 1006 and 1008 are formed by depositing and patterning a Ge layer (e.g., by lithography followed by an etch), and are thus formed by the same set of processing steps. Preferably, these processing steps also define all other electrical features on the MEMS wafer, so that no metallization steps are required in processing the MEMS wafer.

Figure 10D:
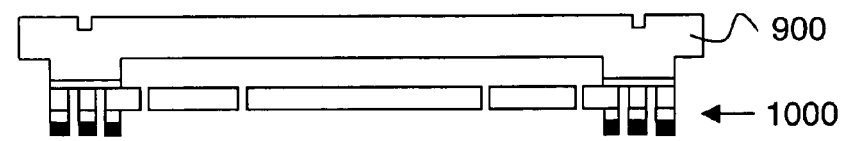

In passing from FIG. 10c to FIG. 10d, the mechanical elements of MEMS wafer 1000 are formed by etching through MEMS wafer 1000. The pattern to be etched can be formed photolithographically. A 2 micron line width and 2 micron spacing is suitable for this etch, which stops on patterned oxide 906. It is preferable for this etching to be performed with an etching process suitable for creating high-aspect ratio features. Deep RIE with Silicon-on-insulator (SOI) anti-footing enhancement is a suitable etch method for this step. At this point in the process, MEMS wafer 1000 essentially has the configuration of a MEMS subassembly having a substantially planar frame and a MEMS device element within the frame (e.g., as in FIG. 1, 5, or 7).

Figure 11A:
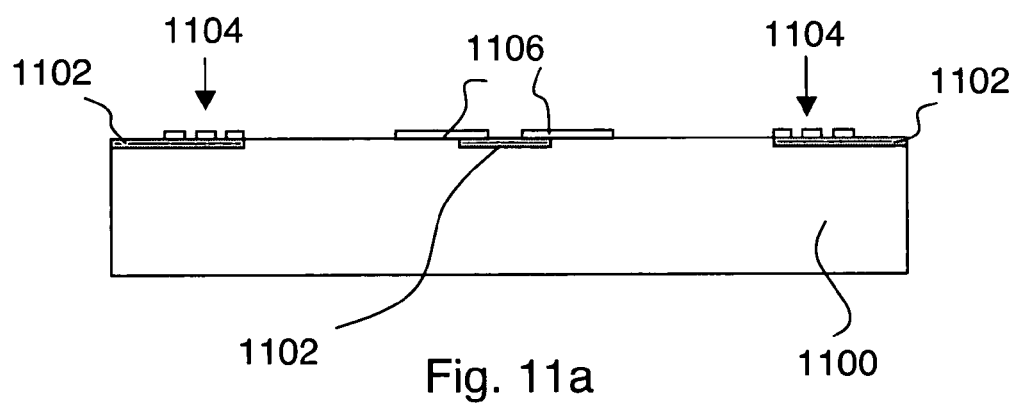
FIGS. 11a–11b show a preferred sequence of processing steps for fabricating a base wafer according to an embodiment of the invention.
Figure 11B:
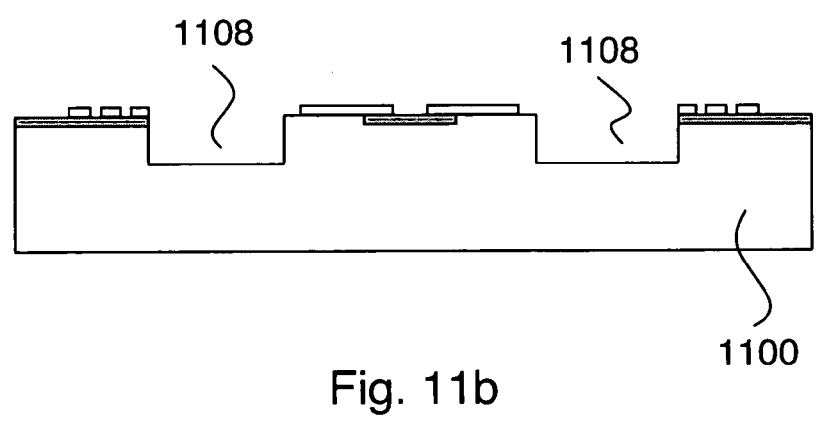

FIGS. 11*a–b* schematically show a sequence of processing steps suitable for fabricating a base wafer 1100, such as base 204 on FIG. 3. On FIG. 11*a*, the active areas of base wafer 1100 are shown as 1102. Active areas 1102 include regions that will make electrical contact with MEMS wafer 1000, as well as circuitry for sensing and/or driving motion of a MEMS device element. Such circuitry is preferably conventional silicon CMOS circuitry. In the preferred embodiment, the last layer of metal deposited in the conventional CMOS process is a metal layer suitable for use as a bond metal. This upper layer of metal defines bond pads 1104 and preferably also defines electrodes 1106. In some cases, active areas 1102 are planarized with chemical-mechanical polishing (CMP) to facilitate bonding to MEMS wafer 1000. In passing from FIG. 11*a* to FIG. 11*b*, recesses 1108 are formed in base wafer 1100. Recesses 1108 are preferably fabricated with DRIE, to a depth of about 100 microns, to accommodate motion of MEMS device elements. At this point in the process, base wafer 1100 essentially has the configuration of base 204 of FIG. 3.

Figure 12A:
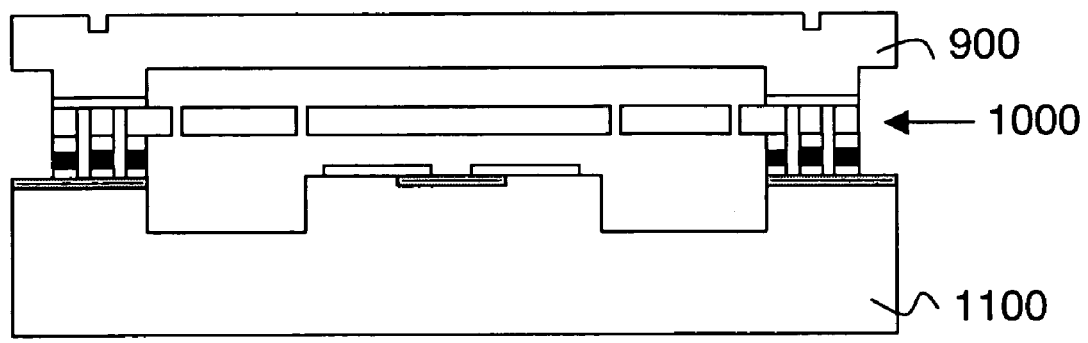
FIGS. 12a–12b show a preferred sequence of processing steps for fabricating a MEMS assembly according to an embodiment of the invention.
Figure 12B:
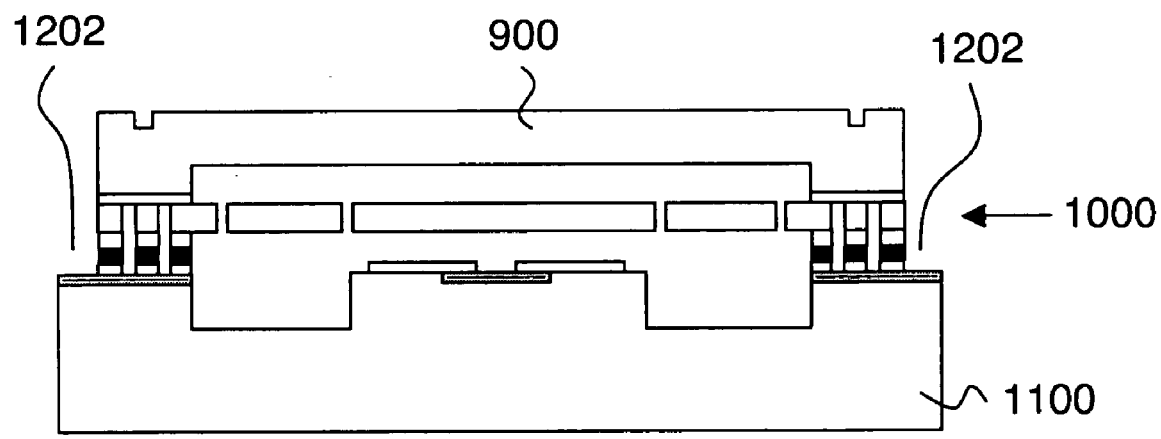

FIGS. 12*a–b* schematically show a sequence of processing steps suitable for final assembly of MEMS wafer 1000, base wafer 1100 and cap wafer 900. On FIG. 12*a*, base wafer 1100 is shown attached to MEMS wafer 1000 via an aligned bond between patterned contacts 1006 and 1008 on MEMS wafer 1000, and bond pads 1104 on base wafer 1100. Since this bonding is the second bonding step in the processing sequence, relatively low temperature bonding processes are preferred. Suitable processes include but are not limited to: eutectic metal bonding, Aluminum-Germanium bonding, solder bonding, Indium-Gold bonding, and polymer bonding. The bond between base wafer 1100 and MEMS wafer 1000 can be hermetic, or it can be non-hermetic for applications not requiring hermeticity. In passing from FIG. 12*a* to FIG. 12*b*, material is etched away from cap wafer 900 to allow access to active areas 1102 from above by providing openings 1202. This etch can be done with DRIE. By allowing access to active areas 1102 from above, external electrical connection of the vertically integrated MEMS device is facilitated. After dicing into individual devices, the assembly of MEMS wafer 1000, cap wafer 900, and base wafer 1100 essentially has the configuration of the MEMS assembly of FIG. 3.

The vertical electrode gap (i.e., the distance between electrodes 210 and MEMS device element 102 on FIG. 3) is determined by the combined thickness of standoff 1002 and patterned contact 1006, and can be precisely controlled (or predetermined) by selecting the height of standoff 1002 and/or the thickness of patterned contact 1006. Although the processing sequence of FIGS. 9–12 shows standoff 1002 being formed exclusively on MEMS wafer 1000, it is also possible to form a standoff exclusively on base wafer 1100, or on both MEMS wafer 1000 and base wafer 1100 in order to define the vertical electrode gap.

This discussion of FIGS. 9*a–d*, 10*a–d*, 11*a–b*, and 12*a–b* provides an exemplary sequence of processing steps suitable for fabricating a preferred embodiment of the invention. Therefore, no single step discussed above is essential for practicing the invention. Furthermore, most of the steps discussed above can be performed using alternate methods not mentioned above, but which are known in the semiconductor processing art. More generally, the entire detailed description has generally been by way of example, as opposed to limitation.

For example, FIGS. 1, 5, and 7 show flexures connecting a MEMS device element to a frame surrounding the MEMS device element. However, the MEMS device element need not be connected to the frame to practice the invention. All that is required is that the MEMS device element be flexibly connected to the MEMS assembly. For instance, MEMS device element 102 can be flexibly connected to cap 202 and/or to base 204, as discussed in U.S. patent application Ser. No. 10/690,224.

Also, FIGS. 2, 3, 6, and 8 show the use of a lithographic feature on the frame to define the vertical gap separation. However, the lithographic feature need not be on the frame to practice the invention. All that is required is that the vertical gap separation be lithographically defined. For instance, a lithographic feature on the base can be used instead of or in addition to a feature on the frame (or elsewhere on the MEMS subassembly), to define the vertical gap separation.

Furthermore, inertial sensor MEMS applications, where the MEMS device element is a proof mass, are discussed above. However, the structures and methods of the present invention are applicable to other MEMS applications, including but not limited to: RF MEMS devices such as switches and resonators, and optical devices such as mirrors.

What is claimed is:

1. A vertically integrated microelectromechanical (MEMS) assembly comprising:
    a MEMS subassembly including a substantially planar frame and at least one MEMS device element within the frame and flexibly connected to the assembly;
    a cap bonded to the frame with a first bond, the first bond being substantially parallel to the frame; and
    a base bonded to a surface of the frame facing away from the cap with a second bond;
    wherein a gap between an electrode on the base and the MEMS device element is defined by a lithographic feature on the frame;
    whereby precise control of the gap is provided and the at least one MEMS device element is enclosed within a cavity.

2. The MEMS assembly of claim 1, wherein the gap between the electrode and the MEMS device element is not equal to a height of the lithographic feature on the frame.

3. The MEMS assembly of claim 1, wherein the gap between the electrode and the MEMS device element is equal to a height of the lithographic feature on the frame.

4. The MEMS assembly of claim 1, wherein the gap is in a range from about 1 micron to about 10 microns.

5. The MEMS assembly of claim 1, wherein the gap is less than about 2 microns.

6. The MEMS assembly of claim 1, further comprising an electrostatic actuator including the electrode for moving the MEMS device element.

7. The MEMS assembly of claim 1, wherein the cap comprises an electrically insulating layer bonded to the frame.

8. The MEMS assembly of claim 1, wherein the cap includes a recess permitting motion of the MEMS device element.

9. The MEMS assembly of claim 1, wherein the cavity is hermetically sealed.

10. The MEMS assembly of claim 9, wherein a gas pressure within the cavity is other than atmospheric pressure.

11. The MEMS assembly of claim 9, wherein a gas within the cavity comprises dry nitrogen, dry air, He, or Ar.

12. The MEMS assembly of claim 1, wherein the base includes a recess permitting motion of the MEMS device element.

13. The MEMS assembly of claim 1, wherein the base further comprises circuitry electrically connected to the MEMS subassembly.

14. The MEMS assembly of claim 13, wherein the circuitry comprises CMOS circuitry.

15. The MEMS assembly of claim 13, wherein the circuitry comprises multilayer metallization, whereby electrical feed through from within the cavity to outside the cavity is provided.

16. The MEMS assembly of claim 13, wherein the second bond is an AlGe bond between Ge on the frame and Al on the base, and wherein the Al is provided by the same processing that provides the circuitry.

17. The MEMS assembly of claim 13, further comprising selective electrical contacts between the frame and the circuitry.

18. A MEMS device comprising a plurality of MEMS assemblies according to claim 1 having a common cap and a common base.

* * * * *